United States Patent
Blodget et al.

(10) Patent No.: US 7,640,526 B1
(45) Date of Patent: Dec. 29, 2009

(54) MODULAR PARTIAL RECONFIGURATION

(75) Inventors: Brandon J. Blodget, Santa Clara, CA (US); Nicholas P. Sedcole, Bradley Stoke (GB)

(73) Assignee: Xilinx, Inc., San Jose, CA (US)

( * ) Notice: Subject to any disclaimer, the term of this patent is extended or adjusted under 35 U.S.C. 154(b) by 425 days.

(21) Appl. No.: 11/225,225

(22) Filed: Sep. 12, 2005

(51) Int. Cl.
*G06F 17/50* (2006.01)
*G06F 9/00* (2006.01)
*G06F 9/45* (2006.01)

(52) U.S. Cl. .............................. 716/16; 716/8; 716/12; 716/14; 716/17; 713/1; 713/100; 703/22

(58) Field of Classification Search ...................... 716/1, 716/8, 12, 14; 703/22; 326/41
See application file for complete search history.

(56) References Cited

U.S. PATENT DOCUMENTS

| | | | |
|---|---|---|---|
| 6,260,182 B1 * | 7/2001 | Mohan et al. ................. | 716/12 |
| 6,292,925 B1 * | 9/2001 | Dellinger et al. .............. | 716/8 |
| 6,457,164 B1 * | 9/2002 | Hwang et al. ................. | 716/8 |
| 6,480,954 B2 * | 11/2002 | Trimberger et al. ............ | 713/1 |
| 6,625,794 B1 | 9/2003 | Trimberger | |
| 6,665,766 B1 | 12/2003 | Guccione et al. | |
| 6,678,646 B1 * | 1/2004 | McConnell et al. ........... | 703/22 |
| 6,903,574 B2 * | 6/2005 | Chen et al. .................... | 326/41 |
| 6,920,627 B2 | 7/2005 | Blodget et al. | |
| 7,269,724 B1 * | 9/2007 | Trimberger et al. ......... | 713/100 |
| 7,301,822 B1 * | 11/2007 | Walstrum et al. ............. | 326/37 |

OTHER PUBLICATIONS

Rudack et al.; "Self-configuration of a large area integrated multiprocessor system for video applications"; Oct. 25-27, 2000; Defect and Fault Tolerance in VLSI Systems, 2000. Proceedings. IEEE International Symposium on; pp. 78-86.*
Sekar et al.; "Configurable platforms with dynamic platform management: an efficient alternative to application-specific system-on-chips"; 2004; VLSI Design, Proceedings. 17th International Conference on; pp. 307-315.*
Xilinx, Inc.; U.S. Appl. No. 11/126,130 by Becker et al. filed May 10, 2005.
Pete Sedcole et al.; "Modular Partial Reconfiguration in Virtex FPGAS"; Aug. 24-26, 2005; International Conference on Field Programmable Logic and Applications; pp. 211-216.
Pete Sedcole et al.; "Modular Dynamic Reconfiguration in Virtex FPGAS"; May 2, 2006; Computer and Digital Techniques; IEE Proceedings, vol. 153, Issue 3; pp. 157-164.

(Continued)

*Primary Examiner*—Helen Rossoshek
(74) *Attorney, Agent, or Firm*—W. Eric Webostad

(57) ABSTRACT

A method for instantiating a design in programmable logic of an integrated circuit is described. First configuration information is generated for configuration of the static portion of the design. The first configuration information includes routing information for routing static routes of the static portion of the design using interconnect lines. Second configuration information is generated for configuration of the at least one dynamic portion of the design. The first configuration information and the second configuration information are merged to provide third configuration information, the third configuration information being for configuration of the at least one module in the programmable logic.

14 Claims, 14 Drawing Sheets

OTHER PUBLICATIONS

U.S. Appl. No. 11/126,130, Becker et al., filed May 10, 2005.
Xilinx, Inc., "The Programmable Logic Data Book," Apr. 2000, pp. 3-75 to 3-96, available from Xilinx, Inc., 2100 Logic Drive, San Jose, CA. 95124.

XAPP290 (v1.0), Lim, Davin et al., "Two Flows for Partial Reconfiguration: Module Based or Small Bit Manipulations", May 17, 2002, 23 pages, Xilinx, Inc., 2100 Logic Drive, San Jose, CA.

* cited by examiner

MODULAR PARTIAL RECONFIGURATION

FIELD OF THE INVENTION

One or more aspects of the invention relate generally to integrated circuits and, more particularly, to reconfiguration of integrated circuits having programmable logic.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles having programmable logic and programmable interconnections. These programmable tiles can include, for example, input/output blocks ("lOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.)

Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Transistor density of FPGAs is sufficient to allow an entire system to be within a single FPGA integrated circuit. A system may be composed of functionally discrete modules, which are interconnected to form such a system. In instances where one or more modules of a system are application-dependent or time-variant, such application-dependent or time-variant modules need not be instantiated at all times of system operation. Having application-dependent or time-variant modules being resident in a system instantiated in an FPGA not only unnecessarily consumes power and circuit resources, but also may limit the size of a system which may be implemented in an FPGA.

Accordingly, others have suggested loading a module responsive to invocation of an application associated therewith, and then removing such module once the application has completed. This type of loading and unloading of a module is known as dynamic modular partial reconfiguration, as it involves unloading of a module without turning off the power to the FPGA. A module may initially be loaded during initial configuration of an FPGA or may be loaded later. Thus, a dynamic modular system may be provided which, if all modules were implemented at the same time would exceed the number of available resources of an FPGA, but by loading and unloading modules dynamically, may be implemented on a single FPGA.

Heretofore, there were some limitations to dynamic modular partial reconfiguration, including the number of modules that could be instantiated in phases, where one module would replace another module in a row or column, without reserving the entire row or column of CLBs for such modules. Moreover, there were limitations involving routing of static routes through modules subject to replacement, such as having to recompile a design or portion thereof.

Accordingly, it would be desirable and useful to provide dynamic partial reconfiguration not limited to having to reserve an entire row or column of CLBs for such dynamic partial reconfiguration usage. Furthermore, it would be desirable and useful if static routes through modules subject to dynamic partial reconfiguration could be preserved without recompilation.

SUMMARY OF THE INVENTION

One or more aspects of the invention generally relate to integrated circuits and, more particularly, to reconfiguration of an integrated circuit having programmable logic and/or programmable interconnections.

An exemplary embodiment of the present invention includes a system for configuring a programmable logic device. The system includes a predetermined part of the programmable logic device reserved for a static portion of a design; means for generating first configuration information, where the first configuration information includes the static portion of the design; means for generating second configuration information, where the second configuration information includes a dynamic portion of the design, and wherein the second configuration information is generated concurrently with the first configuration; and means for merging the first configuration information with the second configuration information to provide at least a partial bitstream for configuring the programmable logic device with the static portion and dynamic portion of the design.

An aspect of the invention is a method for instantiating a design in a programmable portion having programmable logic and programmable interconnections of an integrated circuit. A static portion of the design is obtained. A portion of routing resources for static routes is reserved. The reserved portion of the routing resources is available for configuration of the static portion of the design in the programmable portion of the integrated circuit. First configuration information is generated for configuration of the static portion of the design in the programmable portion of the integrated circuit. The first configuration information includes routing information for routing static routes of the static portion of the design using interconnect lines obtained from the reserved portion of routing resources. Optionally, an allocated resources list is generated responsive to configuration of the static portion of the design. At least one modular version of the design is obtained. The at least one modular version of the design includes at least one dynamic portion of the design. Second configuration information is generated for configuration of the at least one modular version of the design in the programmable portion of the integrated circuit. The second configuration information may optionally include some reserved routing information. The first configuration information and the second configuration information are merged to provide third configuration information, the third configuration information being for configuration of the static and dynamic portions of the design in the programmable portion of the integrated circuit.

Another aspect of the invention is a method for configuring programmable logic of an integrated circuit. First configuration information is read including a static portion of a design. Second configuration information is obtained including a dynamic portion of the design. The first configuration information is exclusively OR gated with the second configuration information to provide a partial bitstream. The programmable logic is programmed with the partial bitstream.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
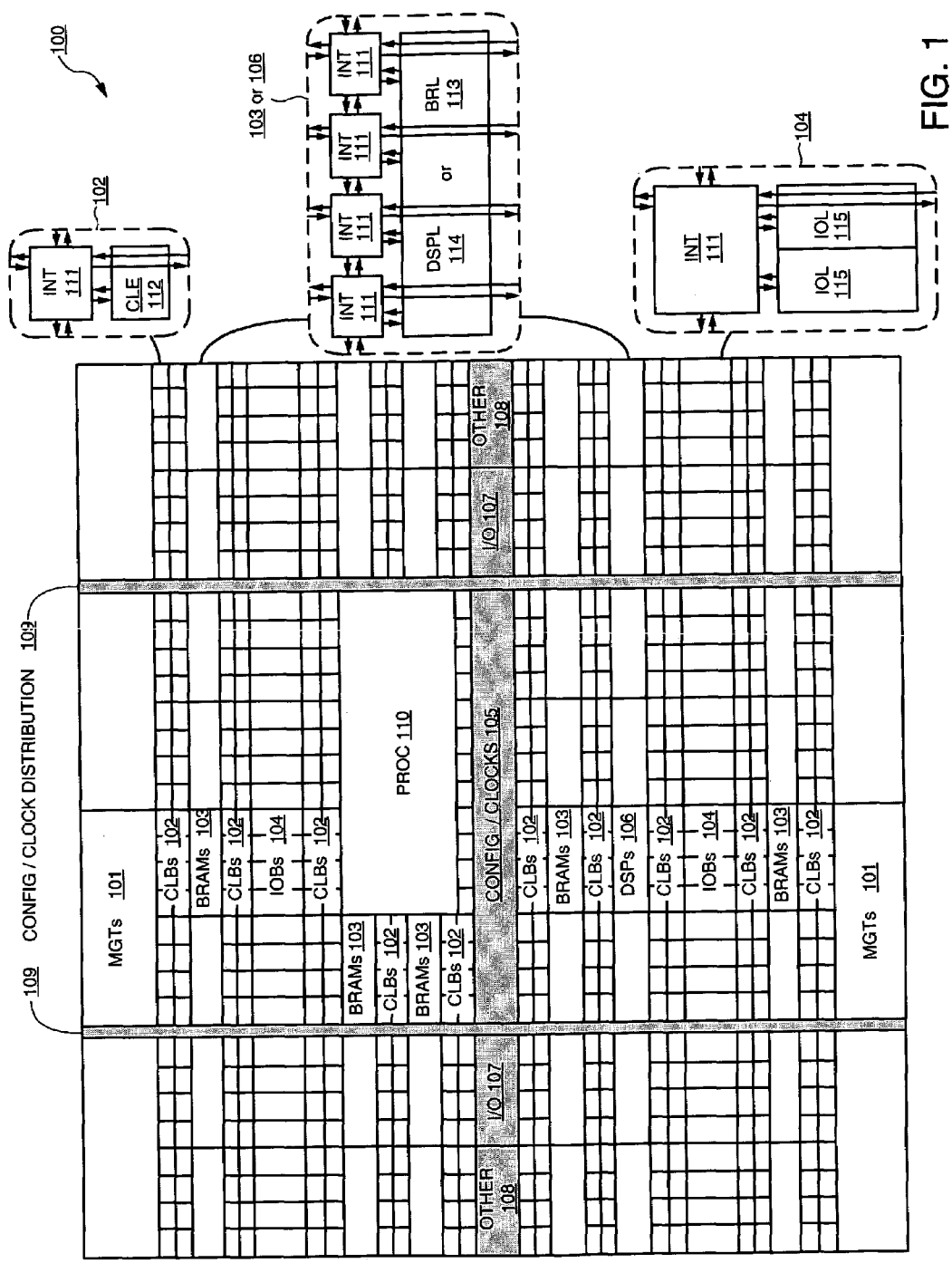
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1. For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
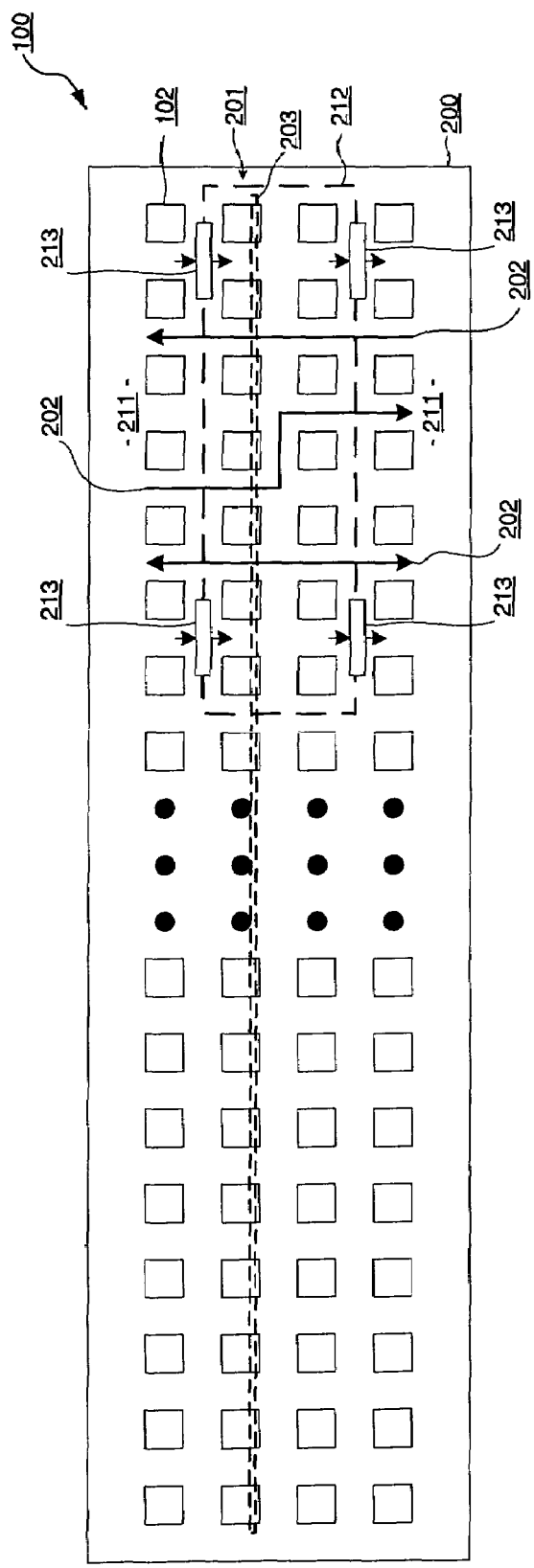
FIG. 2 is a block diagram depicting an exemplary embodiment of the FPGA of FIG. 1 having an array of configurable logic blocks ("CLBs").

FIG. 2 is a block diagram depicting an exemplary embodiment of an FPGA 100 having an array 200 of CLBs 102. Configuration information for configuring one or more of CLBs 102 may be stored in configuration memory associated with such CLBs, as is known. Notably, configuration memory may be read from or written to without halting FPGA 100. For some FPGAs, the smallest unit of configuration memory that may be read or written is a frame, such as frame 203. Frame 203 spans the entire length of a column or row 201 of CLBs 102 of array 200. For purposes of clarity, a column 201 of CLBs 102 shall be referenced hereafter, although a row 201 may be used. Notably, a frame may be one bit wide and conventionally such a configuration frame only spans a fraction of a CLB 102, though a frame may be the entire length of a column 201 of CLBs 102. Notably, while in some FPGA architectures a frame spans the entire length of a column of CLBs, in other FPGA architectures a frame does not span the entire length of a column of CLBs. For example, in FIG. 1, a frame may span only the portion of a column of CLBs extending between vertical areas 109. In such an architecture there may be multiple frames for each column of CLBs. For purposes of clarity by way of example and not limitation, it shall be assumed that column 201 is an entire column of CLBs 102.

As is known, FPGAs may employ "glitchless" partial reconfiguration. Thus, if a configuration bit holds the same value before and after partial reconfiguration of a CLB, the resource controlled by that configuration bit does not experience any discontinuity in operation, with at least two possible exceptions with respect to some FPGAs, namely look-up table ("LUT") random access memory ("LUTRAM") primitives and LUT shift register ("SRL") primitives.

A module may occupy a sub-array 212 including one or more of CLBs 102, provided that primitives which may not be operating in a glitchless manner do not border sub-array 212 and provided that configuration data written to sub-array 212 for overwriting a previously instantiated module is replaced with exactly the same values for static routes, such as static routes 202 extending across such sub-array 212. In this manner, system level routing which is static as part of a static portion 211 of a design instantiated in array 200 may pass through sub-array 212, as configuration data for sub-array 212 with respect to such static routing is persistent on each iteration of modular partial reconfiguration of each module occupying sub-array 212. Thus, it should be understood that all routing within sub-array 212 need not be reserved for multi-phase dynamic modular partial reconfiguration of three or more modules to be instantiated in such sub-array 212.

Bus macros 213 may be used to couple inputs and outputs to and from a module instantiated in sub-array 212 to a static portion 211 of an instantiated design. A bus macro is a predefined unit of logic and wiring to ensure that locations at which signals, or other connections, pass between a reconfigurable module and a static design portion of a system are preserved for each partial reconfiguration iteration, namely module-to-module configuration in a sub-array. Examples of bus macros that may be used include tri-state buffer macros, as are known, as well as slice-based macros, as described in additional detail in a co-pending patent application entitled "Programmably Configurable Logic-Based Macro", by Tobias J. Becker, et. al., application Ser. No. 11/126,130, filed on May 10, 2005 (now U.S. Pat. No. 7,337,422), which is incorporated by reference herein in its entirety.

Notably, positions of modules in a logical hierarchy of a design are not limited to a top level. Thus, driver contentions may be avoided where one module configuration is written over immediately with another. In other words, a default empty configuration need not replace a module in sub-array 212 prior to loading a next module to avoid contention. Furthermore, a full column of CLBs need not be reserved for sub-array 212. Rather, a more efficient use of CLB resources is facilitated, as some CLBs in a column used for dynamic modular partial reconfiguration for three or more modules need not be dedicated as part of a dynamic modular partial reconfiguration region. Furthermore, it should be appreciated that static routes 202 may persist even though one module is replaced with configuration of another module in sub-array 212. In other words, three or more modules may be instantiated sequentially in sub-array 212 without disrupting one or more static routes 202.

Figure 3A:
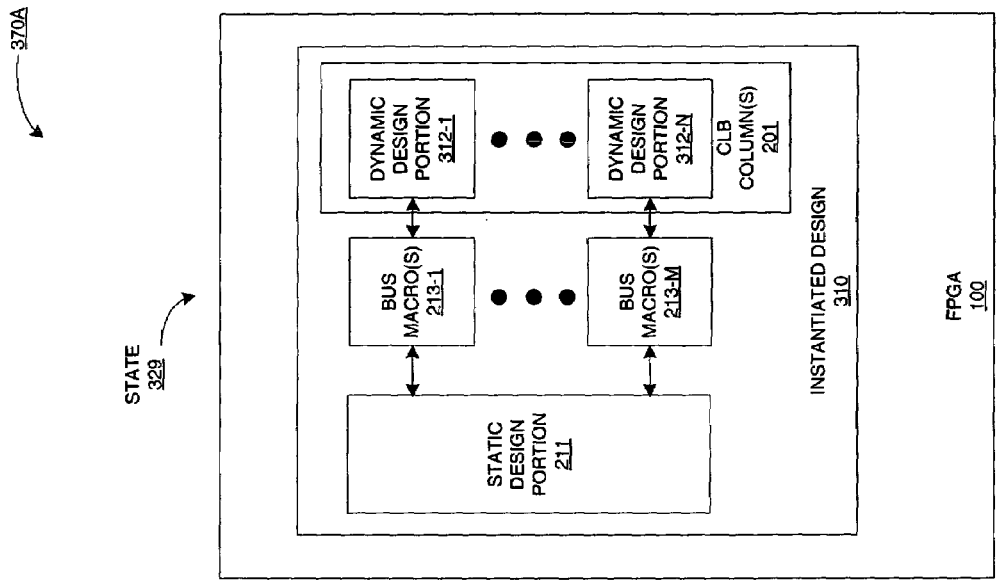
FIGS. 3A through 3C are high-level block diagrams depicting respective exemplary embodiments of alternative partial reconfiguration flows.
Figure 3A:
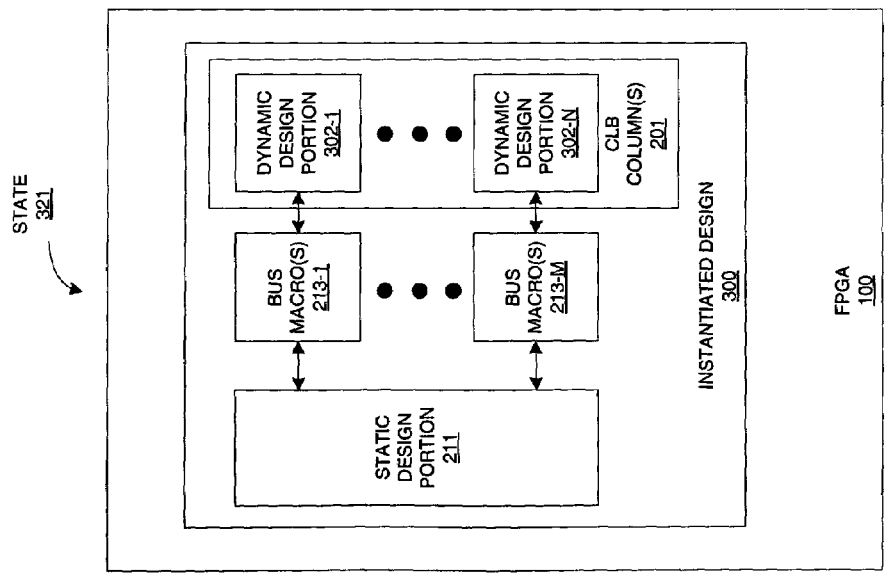

FIG. 3A is a high-level block diagram depicting an exemplary embodiment of a partial reconfiguration flow 370A. Prior to partial reconfiguration 320A, FPGA 100 is in state 321. In state 321, instantiated design 300 includes a static design portion 211 coupled to dynamic design portions or modules (hereinafter "dynamic design portions") 302-1 through 302-N, for N a positive integer greater than one. Dynamic design portions 302-1 through 302-N may be in one or more adjacent CLB columns 201. Static design portion 211 is respectively coupled to dynamic design portions 302-1 through 302-N via bus macros 213-1 through 213-M, for M a positive integer greater than N. Generally there will be two bus macros for each dynamic design portion 302-1 through 302-N. However, for purposes of clarity, each such bus macro shall be assumed to cover all coupling between a static design portion 211 and a respective dynamic design portion 302-1 through 302-N of an instantiated design.

After partial reconfiguration 320A, FPGA 100 is in state 329. In state 329, FPGA 100 has instantiated therein design 310. Instantiated design 310 includes static design portion 211, as well as bus macros 213-1 through 213-M. However, instantiated design 310 includes dynamic design portions or modules 312-1 through 312-N, replacing the previously instantiated dynamic design portions 302-1 through 302-N. Notably, CLB columns 201 previously reserved for dynamic reconfiguration, or more particularly dynamic modular partial reconfiguration, are still reserved for same. However, it should be appreciated that more than one module may be instantiated where all of such modules are at least partially located in a column of CLBs. Furthermore, it should be appreciated that bus macros 213-1 through 213-M do not change for each iteration of dynamic design portion configuration, as all dynamically reconfigurable modules are coupled to static design portion 211 in a same manner. Furthermore, it should be appreciated that not all CLBs in columns 201 need be reserved for dynamic modular partial reconfiguration regions.

Figure 3B:
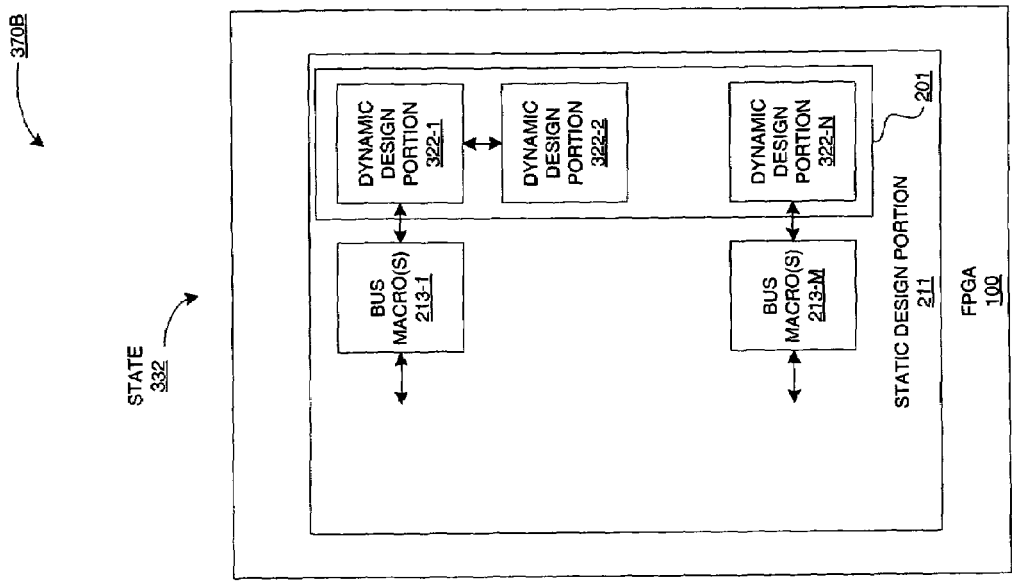
Figure 3B:
Figure 3B:
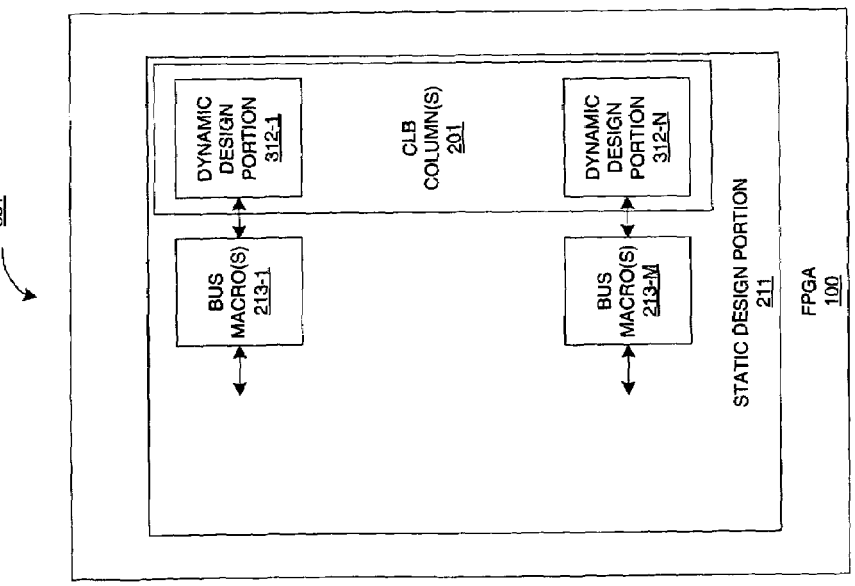

FIG. 3B is a high-level block diagram depicting an exemplary embodiment of a partial reconfiguration flow 370B. Partial reconfiguration flow 370B includes FPGA 100 in state 331. FPGA 100 in state 331 includes bus macros 213-1 and 213-M for respectively coupling dynamic design portions 312-1 and 312-N to static design portion 211. Dynamic design portions 312-1 and 312-N may be located in CLB columns 201. Notably, not all of CLBs in CLB columns 201 need be used in state 331. Notably, dynamic design portions may be included in a static design portion, may border a static design portion, or any combination thereof.

Accordingly, after partial reconfiguration 320B, FPGA 100 is in state 332. In state 332, static design portion 211, as well as bus macros 213-1 and 213-M are the same. Moreover, dynamic design portions 312-1 and 312-N in state 331 are respectively replaced with dynamic design portions 322-1, 322-2, and 322-N in state 332. Thus, unused CLBs in one state may be used in another state, and vice versa, provided such CLBs are reserved for dynamic modular partial reconfiguration. Typically, the bus macros involve static routes, and such bus macros may be instantiated prior to configuration of a module associated therewith. Notably, modules 302-N, 312-N, and 322-N are a series of three modules that may be instantiated one at a time ("multi-phase") in a same sub-array 212 of FIG. 2, though more modules than a series of three may be used. In an alternative embodiment, one or more bus macros may be dynamically added, for example bus macro 213-2, may have been added to accommodate addition of dynamic design portion 322-2 in CLB columns 201.

Figure 3C:
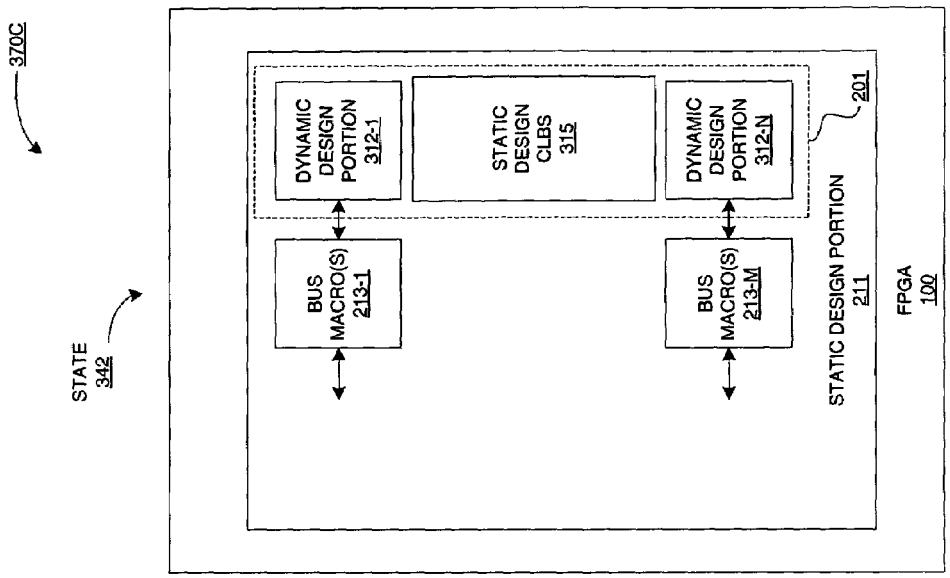
Figure 3C:
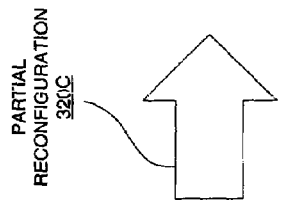
Figure 3C:
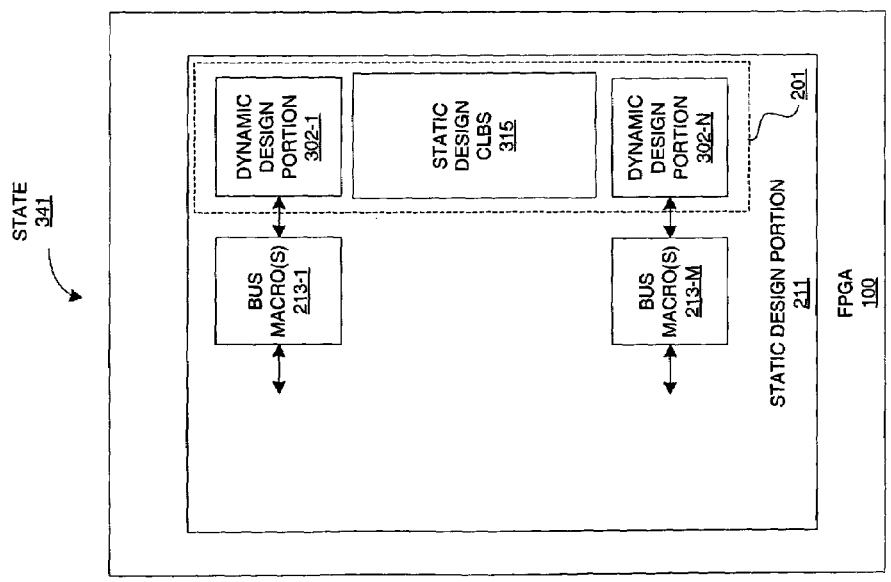

FIG. 3C is a high-level block diagram depicting an exemplary embodiment of a partial reconfiguration flow 370C. In partial reconfiguration flow 370C, FPGA 100 is in state 341. In state 341, static design portion 211 and bus macros 213-1 and 213-M exist. Part of static design portion 211 may consume CLBs 315 in CLB columns 201. Bus macros 213-1 and 213-M respectively couple dynamic design portions 302-1 and 302-N to static design portion 211. After partial reconfiguration 320C, static design CLBs 315 of static design portion 211 may remain constant, as may bus macros 213-1 and 213-M, and dynamic design portions 302-1 and 302-N may be respectively replaced with dynamic design portions 312-1 and 312-N for state 342. One or more modules from both sets of dynamic design portions, namely dynamic design portions 302-1 and 302-N, and 312-1 and 312-N, may be co-located in CLB columns 201, which include CLBs 315 used for static design portion 211. Furthermore, for similar bus macros, position of similar bus-macro coupled modules may be re-located within columns 201 by a shift operation.

Figure 4A:
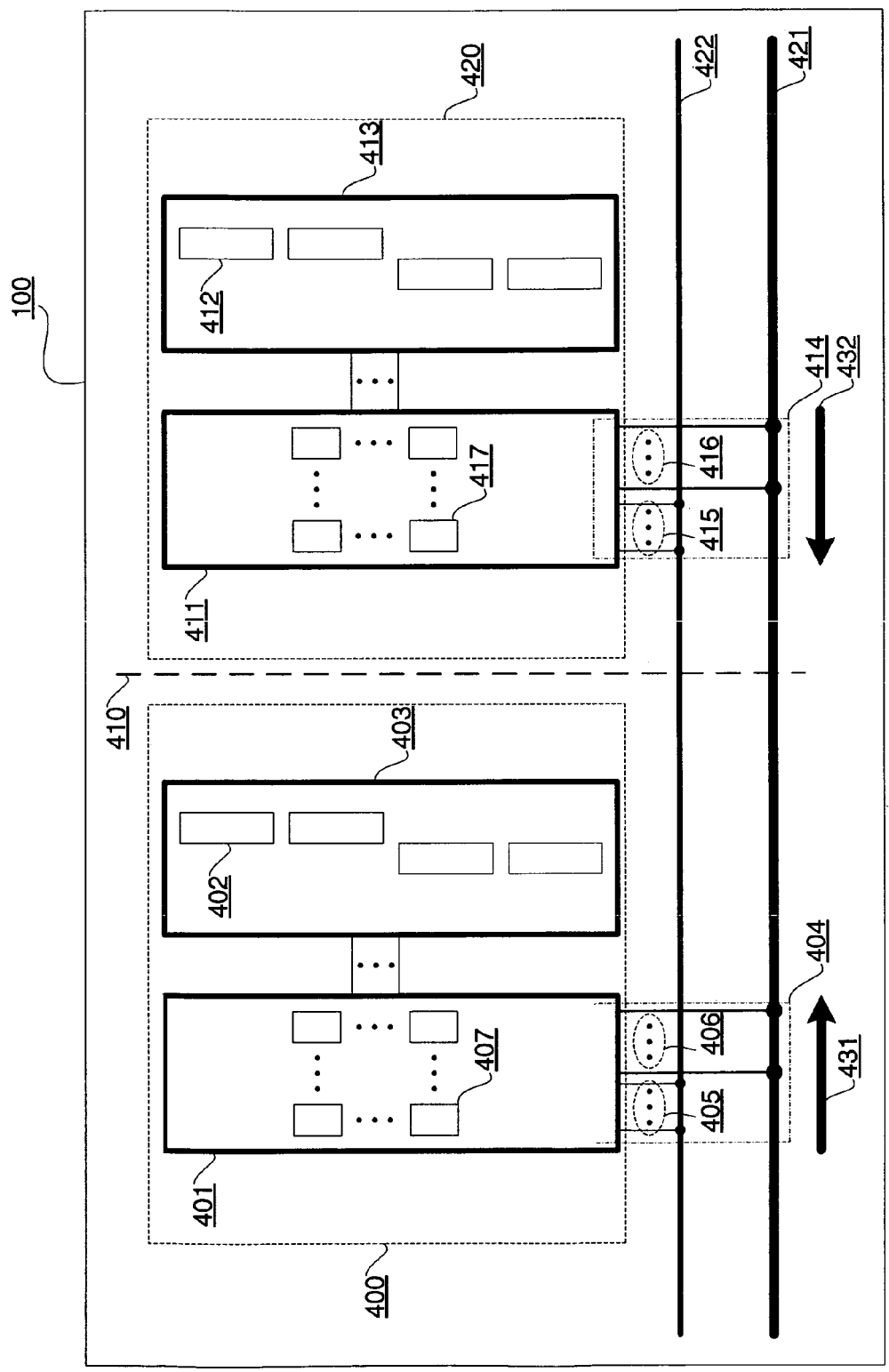
FIG. 4A is a high-level block diagram depicting an exemplary embodiment of an FPGA module boundary between two modules.

FIG. 4A is a high-level block diagram depicting an exemplary embodiment of a module boundary 410 between modules 400 and 420 instantiated in FPGA 100. Module 400 includes switch matrix 401 coupled to CLB 403. As is well known, CLB 403 may include one or more slices 402 which are programmably coupled to interconnect lines via switch matrix 401. Switch matrix 401 may include an array of programmable interconnect points ("PIPs") 407 for this programmable coupling. Module 420 may include switch matrix 411 coupled to CLB 413. Again, CLB 413 may include one or more slices 412 and switch matrix 411 may include an array of PIPs 417.

There are various types of well-known interconnects in FPGA 100. Examples of such interconnects are illustratively shown as horizontal hex lines 422 and horizontal double lines 421, which are illustratively shown as buses by thick black lines. One or more double lines 421 and one or more hex lines 422 may be respectively coupled to switch matrix 401 via double line interconnect bus 406 and hex line interconnect bus 405. Notably, it is not necessary to use more than one type of line, such as both a double line and a hex line, but for purposes of clarity it shall be assumed that both types of interconnects are used. Furthermore, though only horizontal hex and double lines are illustratively shown, it should be appreciated that vertical hex and double lines may be used, as well as other known interconnect topologies.

One or more of hex lines of hex interconnect bus 405 and one or more of double lines of double line interconnect bus 406 may provide interface 404 respectively to one or more hex lines of hex interconnect bus 415 and one or more double lines of double line interconnect bus 416 of interface 414 via hex lines 422 and double lines 421, respectively. Notably, buses 415 and 416 are coupled to switch matrix 411. Notably, directions for signaling between modules 400 and 420 may be unidirectional. Thus, one or more of the hex lines may be associated with a direction 431 for example, and one or more other hex lines may be associated with a direction 432, for example. Furthermore, it should be appreciated that one or more of PIPs 407, for example, may be reserved along with one or more hex lines 405 or one or more double lines 406 for static routing across module 400. Thus, one or more of the hex lines of lines 422 or one or more of the double lines of lines 421, or any combination thereof, may be reserved for static routing. Accordingly it should be appreciated that modules may be programmably instantiated using resources not reserved for static interconnects. Furthermore, it should be appreciated that a set portion of interconnect resources may be reserved for a static design portion.

Figure 4B:
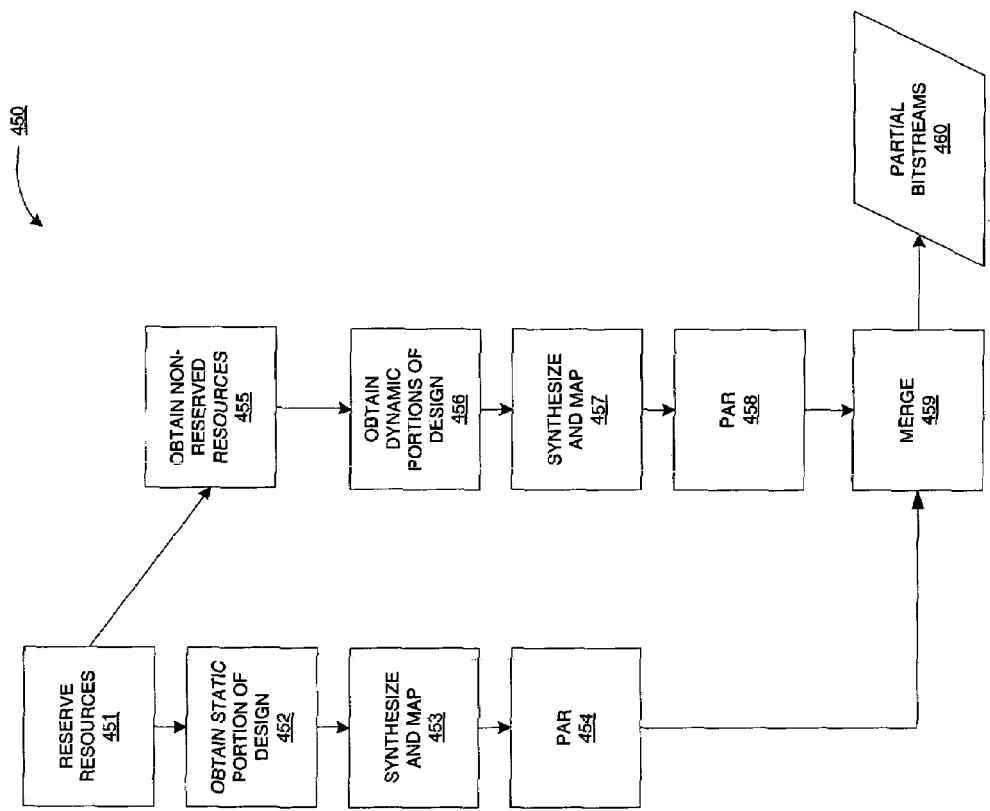
FIG. 4B is a high-level flow diagram depicting an exemplary embodiment of a design flow.

FIG. 4B is a high-level flow diagram depicting an exemplary embodiment of a design flow 450. Notably, design flow 450 assumes that a PAR tool has the ability to reserve routing resources. At 451, routing resources for a static design portion, such as interconnects and PIPs, are reserved. With reference to FIGS. 4A and 4B, the remainder of design flow 450 is described. Notably, interconnects, which may include hex lines 422, double lines 421, or any other known interconnect, may be reserved at 451 along with associated PIPs. Notably, not all reserved interconnects and PIPs need be used in the implementation of a static design portion.

At 452, static portion of a design is obtained. At 453, the static design portion obtained at 452, which may be a netlisting in a hardware description language ("HDL"), is synthesized to a lower-level pre-configuration bitstream state and mapped. At 454, the synthesized static design portion is placed and routed ("PAR"). The routing of the static design is done using interconnects and PIPs reserved at 451. Accordingly, it should be appreciated that because interconnects and PIPs have been reserved for static design routing, such interconnects and PIPs remain constant across a module, such as module 420, irrespective of partial reconfiguration to replace module 420 with another module. Thus, static routes across one or more columns reserved for partial reconfiguration with modules remain unchanged from each dynamic partial reconfiguration to the next.

The amount of resources, such as interconnects and PIPs, reserved for a static design may vary from static design to static design, and may vary depending on the type of interconnect resource being reserved. Once a PAR software tool has placed and routed a static design portion, including using reserved resources, the PAR tool which has a database of all available resources can generate an exclude list 455. Exclude list 455 may be a list of the resources used for placement and routing of the static design portion at 454, as well as the interconnects and PIPs reserved at 451, all of which resources may be excluded from use in future PAR operations within the same design for PAR of dynamic design portions.

At 455, the non-reserved resources of the FPGA, which will be used for the dynamic design portions, are obtained. At 456, one or more dynamic design portions and, in some embodiments, one or more placeholders for the reserved resources 451 (which includes the static design portion having, for example, the static routes and/or the static logic). Note, with the static resource region predetermined up-front by the user, the dynamic design portions can each be designed, synthesized, and mapped independently of the static part of the design. At 457, such one or more dynamic design portions obtained at 456 may be synthesized and mapped at 457. The design synthesized and mapped at 457 may be placed and routed at 458. Notably, such placement and routing of modules done at 458 is done in the non-reserved areas. This ensures that one or more dynamic design portions will not be allocated resources previously allocated for the static design portion. At 459, the result of a static design portion PAR may be merged with the result of the modular design portion PAR to output partial bitstreams 460 respectively for each dynamic design portion.

Thus, it should be appreciated that resources allocated to a static route are not allocated for use in one or more module implementations owing to reservation of such routing at 451. Again, these reserved routing resources at 451, even if unused by the static design portion, are not used for PAR of dynamic modular partial reconfiguration modules. To account for a limitation in a PAR tool having no ability to reserve routing resources, a re-routing post-PAR operation may be done as illustratively shown in FIG. 5A.

Figure 4C:
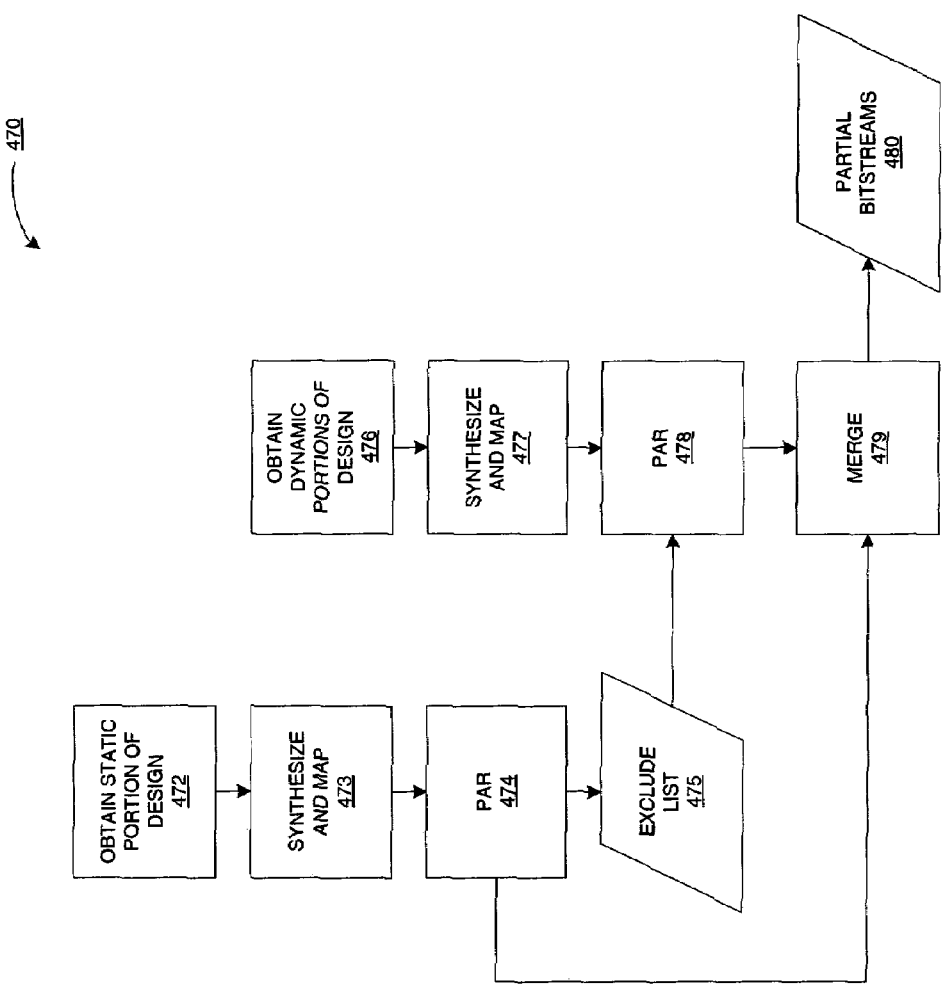
FIG. 4C is a high-level flow diagram depicting another exemplary embodiment of a design flow.

FIG. 4C is a high-level flow diagram depicting another exemplary embodiment of a design flow 470. Notably, design flow 470 assumes that a PAR tool has the ability to reserve routing resources. At 472, a static portion of a design is obtained. At 473, the static design portion obtained at 472, which may be a net listing in a hardware description language ("HDL"), is synthesized to a lower-level pre-configuration bitstream and mapped. At 474, the synthesized static design portion is placed and routed ("PAR"). Exclude list 475 may be a list of the resources used for placement and routing of the static design portion at 474, as well as the interconnects and PIPs reserved using a list of predetermined routes designated by a user in, for example, a user constraint file (UCF).

At 476, one or more modular design portions, including dynamic design portions and optional place holders for the static design portion, all of which may be in the form of one or more netlists, may be obtained. At 477, such one or more dynamic design portions (and optional place holders) may be synthesized and mapped at 477. The design synthesized and mapped at 477 may be placed and routed at 478. Notably, such placement and routing of modules done at 478 is done using exclude list 475. Notably, this ensures that one or more dynamic design portions will not be allocated resources previously allocated for the static design portion. Moreover, the exclude list may include all the predetermined reserved interconnects and PIPs reserved in the UCF. Excluding all reserved interconnects and PIPs, whether used or not in a static design portion, ensures that PAR of such static design portion of a design need not be redone. Otherwise, the exclude list has to be updated each time a module is added into a design, or when such module is changed in its design. At 479, the result of a static design portion PAR may be merged with the result of a modular design portion PAR to output partial bitstreams 460 respectively for each dynamic design portion.

Figure 5A:
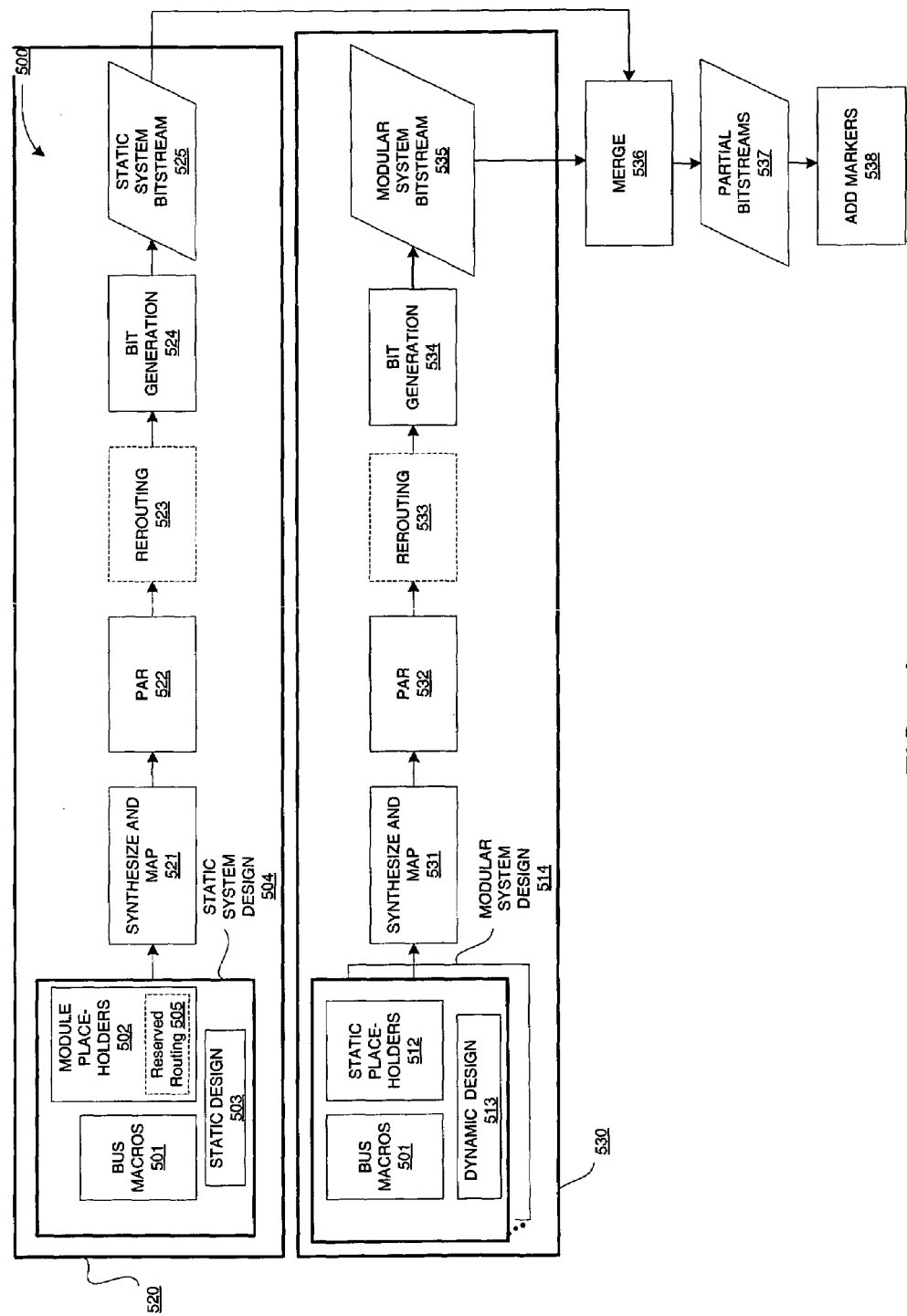
FIG. 5A is a flow diagram depicting an exemplary embodiment of a design flow.

FIG. 5A is a another flow diagram depicting an exemplary embodiment of a design flow 500. A system design 504 includes a static system 503 coupled to one or more module place holders 502 via bus macros 501. Module place holders 502 may be thought of as "black boxes," and will eventually contain the dynamic design(s) 513. In one embodiment optional reserved routing 505, i.e., predetermined static routes, may be designated in the module place holders 502 region and the dynamic design 513 will have to route around these reserved areas. System design 504, which may be in an HDL, is synthesized and mapped at 521. The synthesized or mapped implementation is placed and routed at 522 thereby generating routing constraints. Optionally, at 523 the PAR obtained from 522 is re-routed according to a list of reserved interconnect resources, such as PIPs and interconnect lines. For PAR tools not capable of reserving resources for the static design portion, the placed and routed static system design 504 may be re-routed at 523 to reallocate any use of reserved routing resources assumed by the PAR tool to be available to be returned to a pool of unused resources for implementing static system design 504. After re-routing at 523 or PAR at 522, bit generation for the synthesized, mapped placed, routed, and re-routed design is done at 524 to produce a static system bitstream 525.

Bit generation sub-flow 520 for system design 504 is similar to bit generation sub-flow 530 for modular system design 514. Sub-flow 530 includes obtaining one or more modular system designs 514. Each modular system design 514 includes bus macros 501 for coupling one or more dynamic designs 513 to static placeholders 512, where the static placeholders 512 will eventually contain the static design 503. Each modular system design 514 is synthesized and mapped at 531. The synthesized and mapped implementation for each modular system design 514 is then placed and routed to generate routing constraints at 532. Again, for PAR tools not capable of reserving resources for the static design portion, the placed and routed modular system designs 514 may optionally be re-routed at 533 to reallocate any use of reserved routing resources assumed by the PAR tool to be available to be returned to a pool of unused resources for implementing modular system designs 514. After any re-routing at 533 or PAR at 532, a bit generation of the synthesized, mapped, placed, routed, and re-routed modular system designs 514 may be done at 534. Output of bit generation 534 is modular system bitstreams 535, including the one or more dynamic module designs 512. At 536, bitstreams 525 and 535 are merged to remove redundancy associated with static system design 504 and modular system design 514. Thus the redundant bus macros 510 in either the static system design 504 or the modular system design 514 is removed and the output of the merger 536 is the bus macro 510, static design 503, reserved routing 505, and the one or more dynamic designs 513. Hence there is a partial bitstream for each modular system design 514, namely partial bitstreams 537.

At 538, markers may be added to partial bitstreams 537. For example, flags at the beginning and end of each partial bitstream may be added to indicate that it is a partial bitstream. Alternatively, a flag may be added to the beginning of a partial bitstream indicating frame offset and the length of such stream.

Note partial bitstreams need not be loaded directly to configuration memory. Rather than writing a partial bitstream directly to configuration memory, a current configuration of an instantiated design, or, more particularly, affected configuration frames thereof, may be read back from the FPGA and modified with information from one or more partial bitstreams before being written back to the FPGA. This may be done on a frame-by-frame basis, which limits the amount of memory employed to buffer the readback. Accordingly, it is possible to have two or more module regions aligned within a same column of CLBs within an FPGA by effectively masking off parts of the configuration.

Figure 5B:
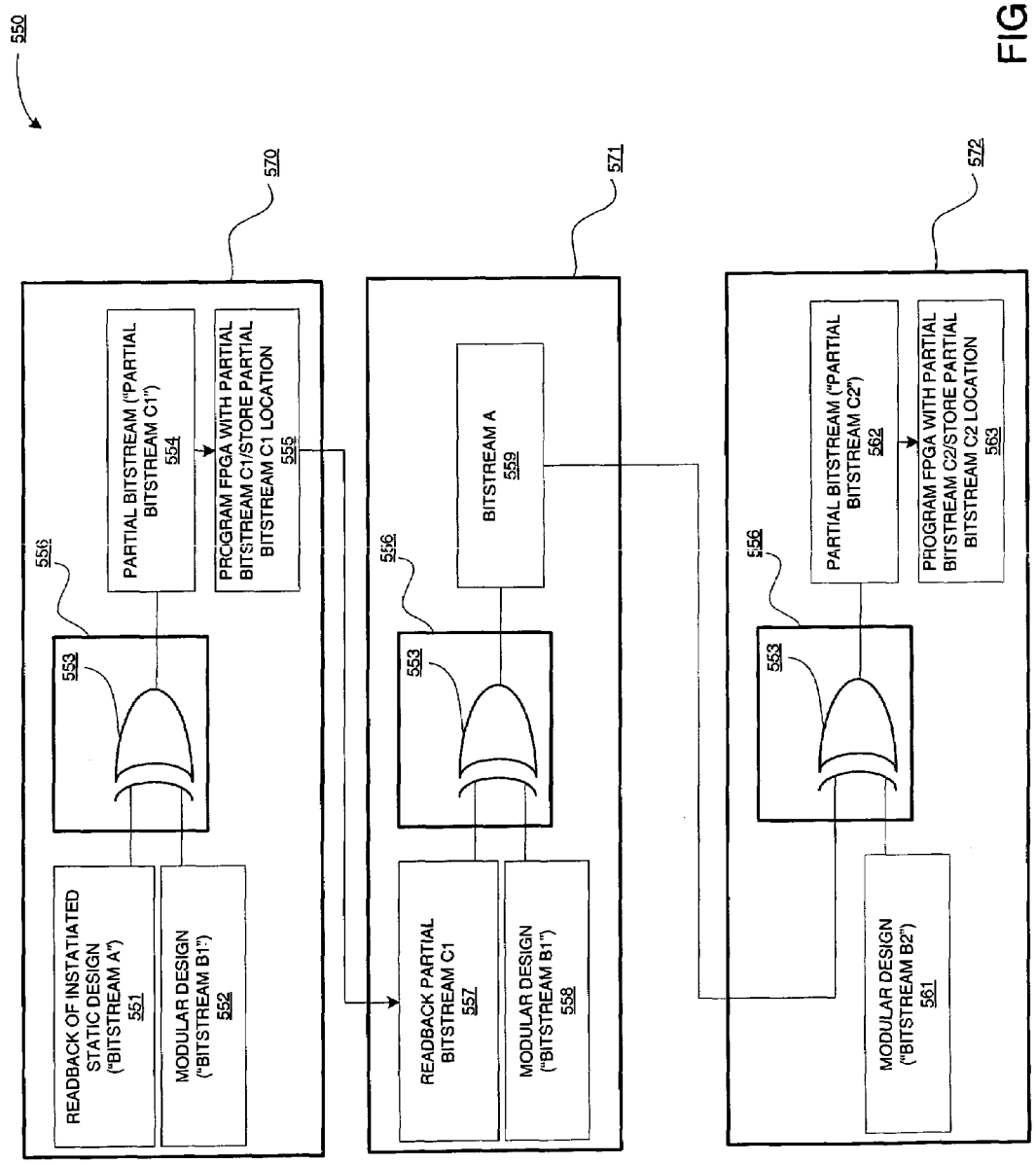
FIG. 5B is a high-level signal flow diagram depicting an exemplary embodiment of a dynamic design module load flow.

FIG. 5B is a high-level signal flow diagram depicting an exemplary embodiment of a dynamic design module load flow 550. At 551, a design instantiated in programmable logic of an FPGA is read back, namely "Bitstream A." Notably, Bitstream A need not be read back, but may be obtained from storage in memory other than configuration memory. However, for purposes of clarity by way of example and not limitation, it shall be assumed that Bitstream A is obtained from a readback operation of an FPGA configured with a static portion of a design. Furthermore, it should be understood that not all of the static portion of a design need be read back. Rather only a column or columns of configuration memory associated with one or more modules to be loaded may be read back. For example, a readback may include a starting frame and offset from such starting frame to read back only the column or columns of configuration memory associated with the one or more dynamically loadable modules to be loaded. Notably, though a single starting frame is used in this example, there may be multiple starting frames and associated offsets for generating multiple partial bitstreams as described below in additional detail.

At 552, a modular design bitstream, which includes one or more modular designs, is obtained, where each modular design may include a dynamic design portion of the circuit design and a static design placeholder region having all logic 0s reserved for the static design portion. In addition the modular designs have the bus macros removed (the bus macros are only in the static design, e.g., Bitstream A). This modular design bitstream 552 is indicated as being "Bitstream B1" for purposes of clarity. Bitstreams A and B1 are input to an XOR operator 556, such as XOR gate 553, the output of which at 554 is a partial bitstream, namely "Partial Bitstream C1," having the static design with the bus macros and the one or more dynamic designs. Again, it should be appreciated that Bitstream A need not be the entire static portion of a design, but may be only the column or columns of configuration memory associated with Bitstream B1. Thus, within such column or columns of configuration memory, any resource or resources reserved for the static portion of the design, such as static routing for example, will continue to be reserved as they will appear in each Partial Bitstream C1. Each bit of Partial Bitstream C1 is generated as being one of three possible states. One state is that neither the static design portion nor the dynamic design portion uses the resource, in which instance the configuration bit for such resource from the frame of data read back and to be loaded as part of a partial bitstream is a logic 0. In another state, the static design portion may use the resource, in which event the resource is not available for any dynamic module. In this case the modular design (e.g., Bitstream B1) includes a reserve resource region, i.e., placeholder, for the static design (Bitstream A1) and this reserved region is set to all 0s. XORing the modular design with the static design will insert the static design into the modular design placeholder region and give 1 or 0 depending upon the logic value of the static design. Lastly, the third state is that the static design portion does not use the resource, i.e., all areas outside of the reserved region have 0s. and thus after the XOR operation the resulting configuration bits in these non-reserved regions are the logic values of the dynamic design portion. At 555, an FPGA may be programmed with Partial Bitstream C1 which has both the dynamic and static portions of the design (including the bus macros), and Partial Bitstream C1 may be stored in memory other than configuration memory for subsequent retrieval. However, for purposes of clarity by way of example and not limitation, it shall be assumed that a frame and offset are stored for each partial bitstream written to configuration memory for a partial readback responsive to such frame and offset information.

At 557, Partial Bitstream C1 (dynamic and static design portions) is read back from configuration memory using stored frame and offset information. At 558, Bitstream B1 (dynamic design portion(s) minus the bus macros and static placeholder design portion) is obtained. Bitstream B1 may be obtained from storage in separate memory. Bitstreams C1 and B1 are input to an XOR operator, such as XOR gate 553, the output of which at 559 is Bitstream A (static design portion). Alternatively, Bitstream A may be retrieved from storage.

At 561, a modular design bitstream, which includes one or more modules, is obtained. This modular design bitstream is indicated as being "Bitstream B2" for purposes of clarity, and may be different from Bitstream B1. For example, Bitstream B2 includes second dynamic design portions (but does not include the bus macros) to replace the first dynamic design portions of Bitstream B1. Bitstream B2 also has, for example, a static design placeholder for the static design, where the static design placeholder has logic value 0. Bitstreams A and B2 are input to an XOR operator, such as XOR gate 553, the output of which at 562 is a partial bitstream, namely "Partial Bitstream C2." When there is more than one dynamic design each Partial Bitstream C2 has one of the dynamic designs and may include parts of the static design. Because the partial bitstreams can be completely swapped to replace all bits within a frame associated with the module, as indicated by markers, there is no contention between values of the partial bitstreams. At 563, the FPGA may be programmed with Partial Bitstream C2. Partial Bitstream C2 may be stored for subsequent retrieval from configuration memory.

As a dynamic design portion or module includes no information on static routing, it should be appreciated that such module is position independent. Thus, a module or modules are re-locatable subject to an appropriate bus macro for coupling. Furthermore, one or more modules may be loaded in several stages by separating information into several partial bitstreams which may be effectively overlaid one upon another in time to provide time-varying application of such modules to a design. Notably, though the above example of FIG. 5B was for frame-by-frame modification, there may be sub-frame dynamic module modification.

Figure 5C:
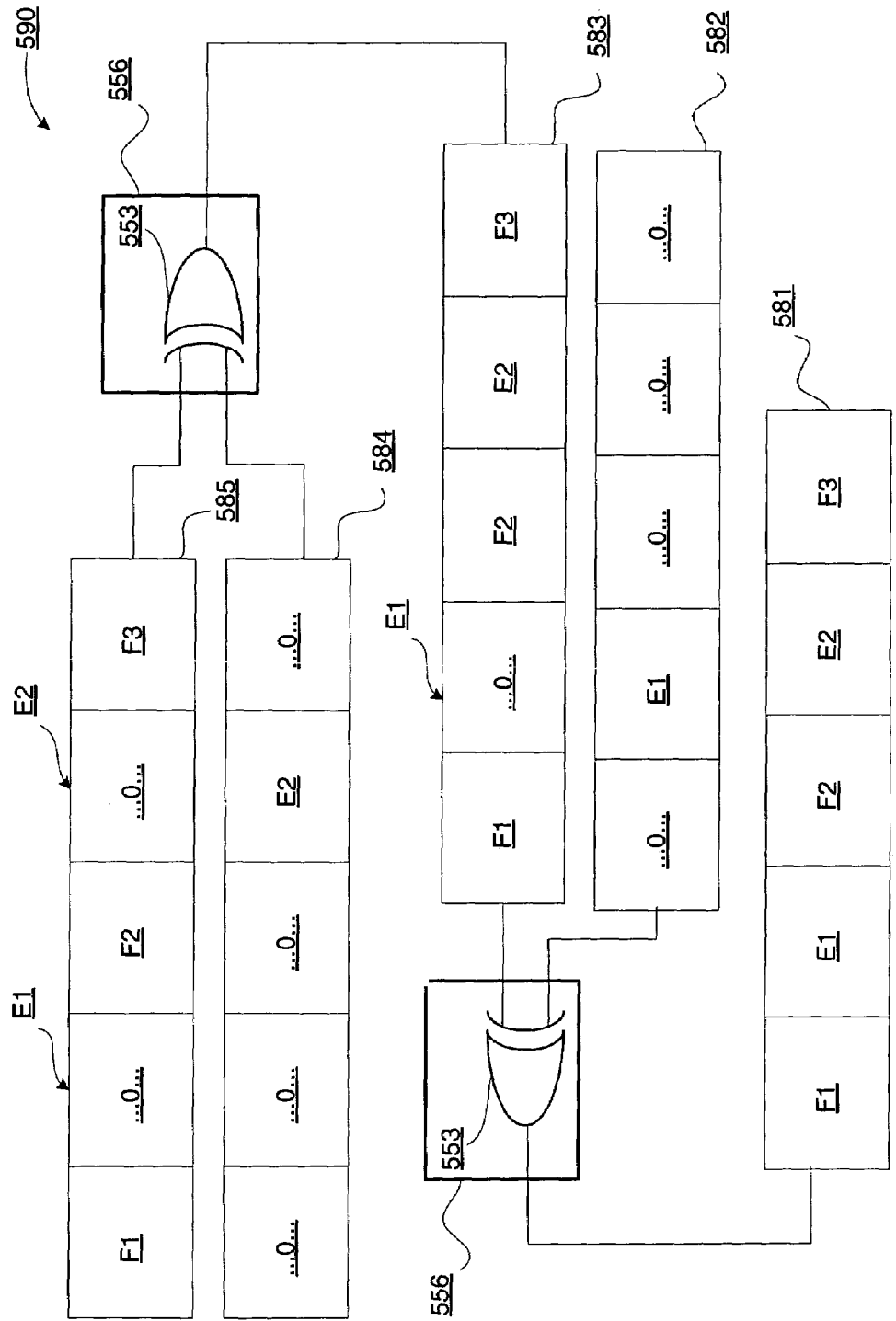
FIG. 5C is a high-level flow diagram depicting an exemplary embodiment of a sub-frame dynamic module modification flow for loading sub-frame partial bitstream configuration information.

FIG. 5C is a high-level flow diagram depicting an exemplary embodiment of a sub-frame dynamic module modification flow 590 for loading sub-frame partial bitstream configuration information. In this example, a frame 581 has five sections, namely sections F1, E1, F2, E2, and F3 though fewer or more sections may be used. Of these sections, sections E1 and E2 represent independent sub-frame partial bitstreams for dynamic alteration of an instantiated design. Notably, fewer or more than two dynamically alterable sub-frame partial bitstreams may be used. For example, sub-frame configuration data associated with sections E1 and E2 may be loaded by XORing. Frame 585 has sections F1, F2, and F3 which may have static design configuration data. Sections E1 and E2 of frame 585 are all zeros indicating sub-frame placeholders. Frame 584 has a section E2 that is co-located relative to section E2 of frame 585. All sections, other than section E2, of frame 584 have all zeros, and section E2 of frame 584 has dynamically loadable sub-frame configuration data. Thus, by XORing frames 585 and 584, frame 583 may be produced where all sections, other than section E1, have configuration data, and section E1 has all zeros. Then frame 583 may be XOR'd with frame 582 to obtain frame 581. Frame 582 has a section E1 that is co-located relative to section E1 of frame 583. All sections, other than section E1, of frame 582 have all zeros, and section E1 of frame 582 has dynamically loadable sub-frame configuration data. By XORing frames 583 and 582, frame 581 may be produced where all sections have configuration data.

Thus, it should be appreciated that each module may be applied subject to variation of the application. Furthermore, different sets of modules may be instantiated at different times depending on application. Moreover, such modules may include sub-frame configuration information that is dynamically loadable.

Figure 5D:
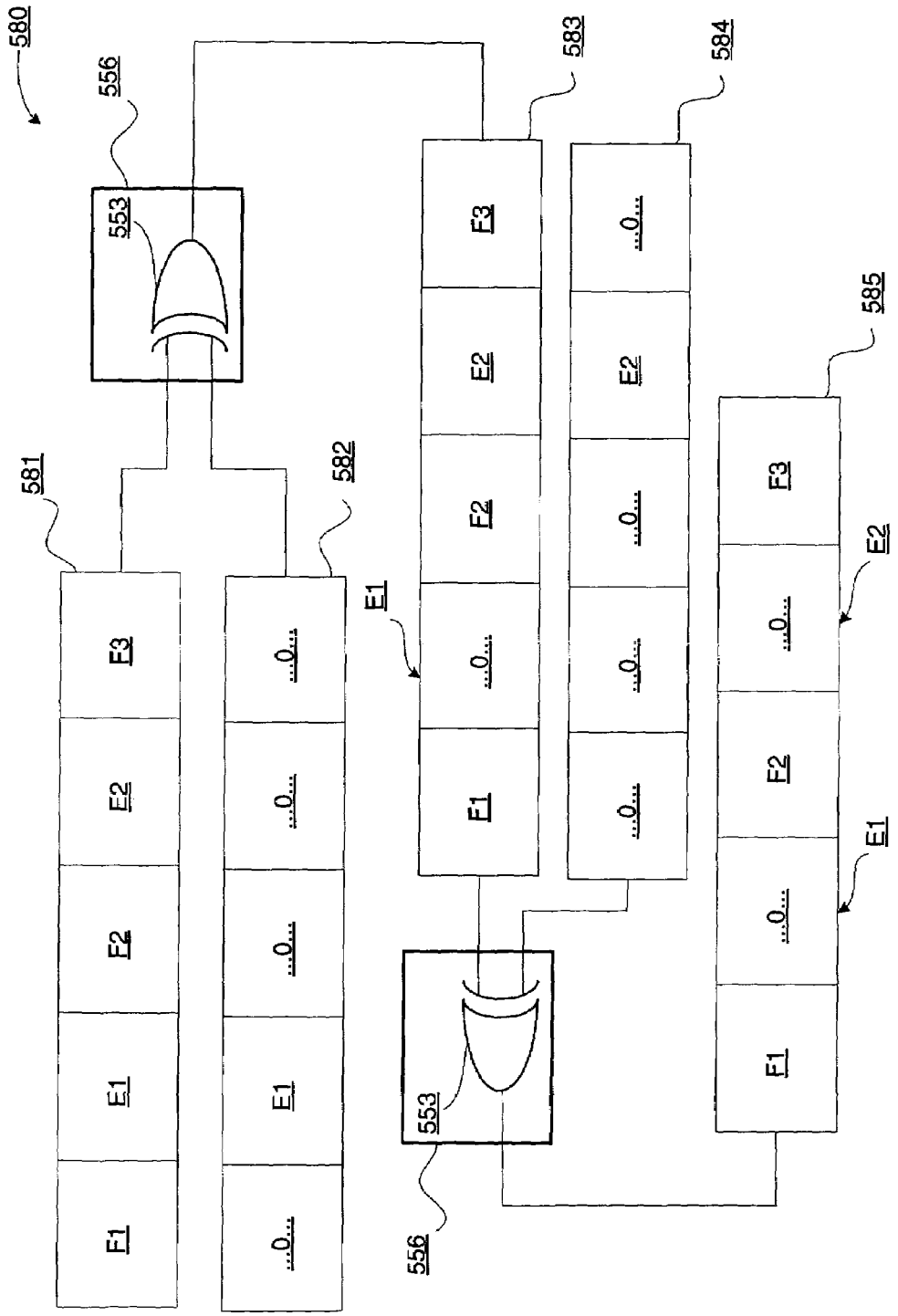
FIG. 5D is a high-level flow diagram depicting an exemplary embodiment of a sub-frame dynamic module modification flow for unloading sub-frame partial bitstream configuration information.

FIG. 5D is a high-level flow diagram depicting an exemplary embodiment of a sub-frame dynamic module modification flow 580 for unloading sub-frame partial bitstream configuration information. Configuration data for frame 581 may be merged by an XOR operator 556, such as with XOR gate 553, with another frame 582. In frame 582 all bits are set to zero except those for section E1 to unload section E1 configuration data from frame 581, namely to provide frame 583 configuration data for sections F1, F2, E2, and F3, and with section E2 all zeros.

On a subsequent pass, configuration data for frame 583 may be XOR'd with another frame 584. Frame 584 has all bits set to zero except for those for section E2 to unload section E2. Output frame 585 from this second XOR operation has configuration data for sections F1, F2, and F3, which may be a static portion of a design, and has all logic zeros for sections E1 and E2. It should be appreciated that by reversing the process, configuration data for sections E1 and E2 may be unloaded.

Figure 6A:
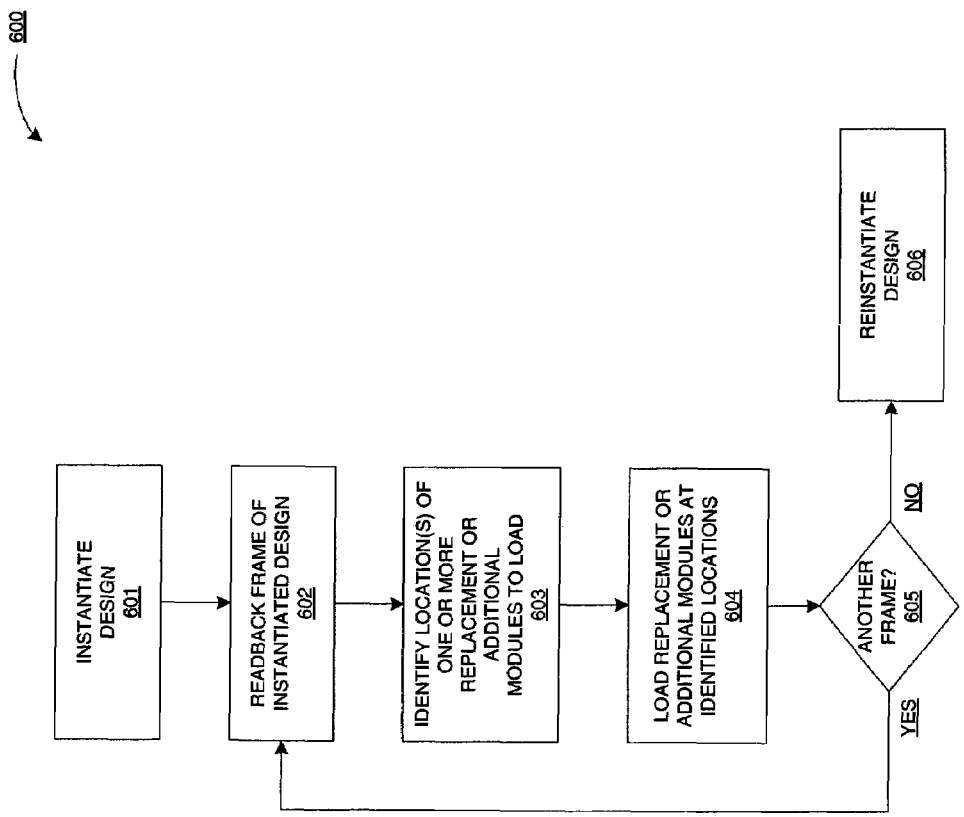
FIG. 6A is a flow diagram depicting an exemplary embodiment of an FPGA dynamic modular partial reconfiguration flow.

FIG. 6A is a flow diagram depicting an exemplary embodiment of an FPGA dynamic modular partial reconfiguration flow 600. At 601, a design is instantiated in an FPGA. At 602, a frame of the design instantiated at 601 is read back. At 603, a location or locations of one or more replacement or additional modules to be dynamically partially reconfigured for the instantiated design are identified. As mentioned above, markers may be inserted in partial bitstreams to identify these locations. For example, a sequence of all 0s may be used. Accordingly, a partial bitstream for may exist within a configuration frame bitstream for an instantiated design, which may include a combination bits associated with static design circuits and dynamic design circuits when read back.

At 604, replacement or additional modules are loaded at locations identified at 603. Accordingly, at 604, a frame associated with a portion of a column of CLBs may have therein replacement or additional module data which has been inserted during runtime of the FPGA to effect a partial reconfiguration of the FPGA. Accordingly, there may be additional frames to be read, modified, and written back to complete a partial reconfiguration involving multiple configuration frames. At 605, a check for another frame to be accessed to complete the partial reconfiguration may be done. If there is another frame to be accessed, then such frame may be read back at 602. Accordingly, flow 600 may proceed as previously described from that point for the additional frame or frames. Furthermore, though not shown but as described elsewhere herein, each frame may be buffered at 602 in FPGA 100 for this readback.

If there are no other frames to be read back as determined as 605, then the design may be re-instantiated in the FPGA at 606. Notably, only affected frames need be read, modified, and re-instantiated at 606, namely those frames having additional or replacement module data for the partial reconfiguration.

Figure 6B:
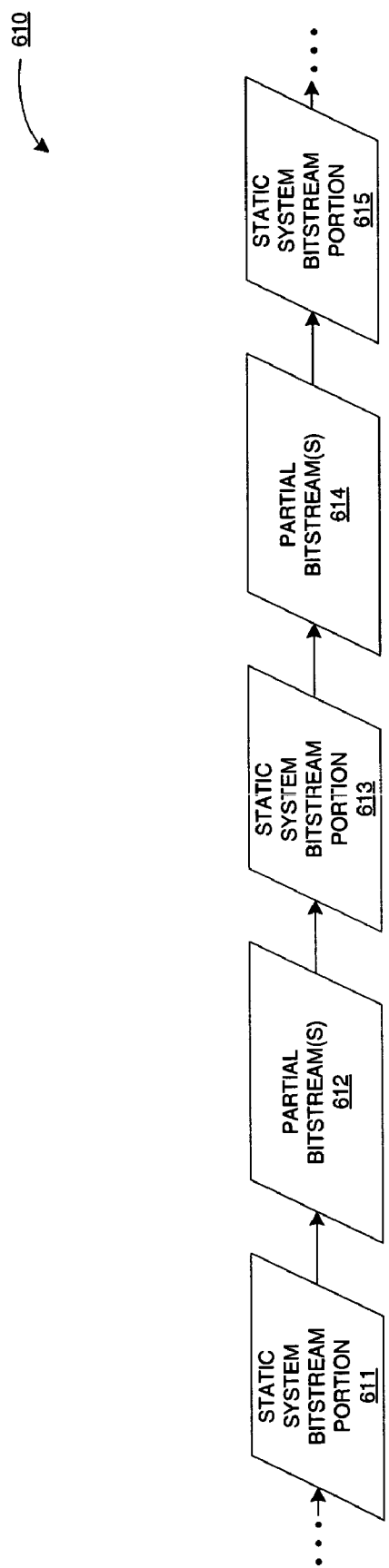
FIG. 6B is a high-level data diagram depicting an exemplary embodiment of a partial reconfiguration bitstream.

FIG. 6B is a high-level data diagram depicting an exemplary embodiment of a partial reconfiguration bitstream 610. Notably, partial reconfiguration bitstream 610 may be for a frame or frames as multiple modules may be located in a column; moreover, such multiple modules may be separated by CLBs used for a static design portion. Thus, for example, a partial reconfiguration bitstream 610 may include static system bitstream portion 611, followed by one or more partial bitstreams 612. The one or more partial bitstreams 612 may be followed by a static system bitstream portion 613, which is in turn followed by one or more partial bitstreams 614. Following the one or more partial bitstreams 614 may be a static system bitstream portion 615. This is merely an example of a reconfiguration bitstream flow for dynamic modular partial reconfiguration. Accordingly, it should be appreciated that other reconfiguration bitstream formats may be used.

Moreover, a shift before an XOR operation may be used to retarget location of placement of a module to another location. Furthermore, hard macros may be used to lock down specific routes. Notably, for hard macros implemented with tri-state drivers, a two-phase module reconfiguration process may be used. For example, two partial bitstreams for a module may be generated. In the first design of the tri-state buffers, the tri-state buffers may be configured normally, but in the second design, which may be created by copying the first design and then disconnecting the tri-state buffers from bus lines, the outputs of the tri-state buffers are not coupled to bus lines. Accordingly, merging bitstreams of the first and second designs to remove redundancy from the second bitstream, a partial bitstream carrying just the information used to connect the module via tri-state buffers to bus lines may be generated. Thus, the module may be loaded with two successive merge operations, as previously described, and such module may be removed by repeating these same two merge operations in reverse order.

It should be understood that a read-modify write operation used to load a partial bitstream may be done in software to identify which frames associated with such partial bitstream are to be read from an FPGA. Thus, the identified frames may be read, parts of those frames may be modified, and the modified frames written back to instantiate the module, along with any associated resources configured responsive to the frames identified. The information associated with the partial bitstream again may be merged with a current configuration read back from an FPGA using an XOR function to combine two bitstreams. Such module may be removed by repeating the XOR merge operation. Modules may be allocated any rectangular region in a device, and static routes may pass through such rectangular region or regions. Again, to avoid conflicts, some routing resources may be reserved for static routes. Notably, merger of partial reconfiguration bitstreams and a current configuration bitstream may be done during runtime for retargeting of module bitstreams or multi-phase reconfiguration, or any combination thereof. Notably, when reading current configuration information, such data may be prepended with a pad frame. Similarly, when writing back revised configuration information, such data may be prepended with a pad frame after the final frame of readback data.

Although an FPGA may include an embedded processor or have instantiated therein a "soft" processor having access to bitstreams for dynamic modular partial self-reconfiguration, where such bitstreams are stored in internal memory of such FPGA or in external memory coupled to such FPGA, self-reconfiguration capability, such as respectively via an internal configuration access port or a map port need not be implemented. For example, dynamic modular partial reconfiguration may be done with a personal computer coupled to an FPGA, or an external processor coupled to an FPGA. Accordingly, while the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, though frames are used, other increments of configuration data may be used. Claim(s) listing steps do not imply any order of the steps. Trademarks are the property of their respective owners.

What is claimed is:

1. A method for instantiating a design in a programmable portion of an integrated circuit, the method comprising:
   obtaining a static portion of the design;
   reserving a portion of routing resources for static routes as associated with the static portion of the design leaving another portion of the routing resources unreserved with respect to the static routes for being available for use by dynamic portions of the design;

generating first configuration information for configuration of the static portion of the design in the programmable portion of the integrated circuit, the first configuration information including first routing information for routing the static routes of the static portion of the design using the reserved portion of the routing resources reserved for the static routes;

obtaining at least one modular version of the design, the at least one modular version of the design including a dynamic portion of the dynamic portions of the design;

generating second configuration information for configuration of the at least one modular version of the design, the second configuration information including second routing information for routing routes of the dynamic portion of the design using the unreserved portion of the routing resources;

merging the first configuration information and the second configuration information to provide third configuration information for at least partial configuration of the programmable portion; and performing the at least partial configuration of the programmable portion responsive to the third configuration information to physically transform the programmable portion from a first operational state to a second operational state;

wherein bus macros information for interfacing the static portion of the design with the dynamic portions of the design is the same for both the static portion of the design and the dynamic portions of the design;

wherein the dynamic portions are capable of being different from one another without having to vary the static portion of the design for coupling the dynamic portions thereto responsive to the bus macro information being the same in both the first configuration information and the second configuration information; and wherein one or more of the steps are performed by a processor.

2. The method according to claim 1, wherein each of the first configuration information and the second configuration information includes the bus macro information for configuration of at least one bus macro for coupling the at least one module to the static portion of the design.

3. The method according to claim 2, wherein the merging removes redundant bus macro information from either the first configuration information or the second configuration information when generating the third configuration information.

4. The method according to claim 3, wherein the third configuration information includes at least one bitstream suitable for modular partial reconfiguration of the programmable portion during runtime of the design instantiated in the integrated circuit.

5. The method according to claim 4, further comprising amending the at least one bitstream with marker information, the marker information indicating position of the at least one bitstream for loading in a configuration frame.

6. The method according to claim 5, wherein the first configuration information and the second configuration information are generated at least in part from:

synthesizing the static portion of the design and independently synthesizing the dynamic portion of the design;
mapping the static portion of the design and independently mapping the dynamic portion of the design;
placing the static portion of the design and the dynamic portion of the design; and
routing the static portion of the design and the dynamic portion of the design.

7. The method according to claim 6, wherein the first configuration information and the second configuration information are generated in part from:

re-routing of the static portion of the design and the dynamic portion of the design responsive to the reserved portion of the routing resources, wherein at least one of the static routes extends across the dynamic portion of the design.

8. The method according to claim 7, wherein the synthesizing includes converting the static portion of the design and the dynamic portion of the design from a hardware description language to a lower-level pre-configuration bitstream.

9. The method according to claim 7, wherein the integrated circuit is a programmable logic device.

10. The method according to claim 9, wherein the integrated circuit is a Field Programmable Gate Array.

11. A system for configuring a programmable logic device, comprising:

a predetermined part of routing resources of the programmable device reserved for a static portion of a design leaving a portion of the routing resources unreserved with respect to the static portion of the design for being available for use by dynamic portions of the design;

means for generating first configuration information, the first configuration information including the static portion of the design;

means for generating second configuration information, the second configuration information including a dynamic portion of the dynamic portions of the design, wherein the second configuration information is generated concurrently with the first configuration information;

an XOR operator for merging the first configuration information with the second configuration information to provide at least a partial bitstream for configuring the programmable device with the static portion and the dynamic portion of the design;

the first configuration information being associated with the predetermined part of the routing resources reserved for the static portion of the design; and the second configuration information being associated with the portion of the routing resources unreserved for the static portion of the design and employed for the dynamic portion of the design;

wherein bus macros information for interfacing the static portion of the design with the dynamic portions of the design is the same for both the static portion of the design and the dynamic portions of the design; and wherein the dynamic portions are capable of being different from one another without having to vary the static portion of the design for coupling the dynamic portions thereto responsive to the bus macro information being the same in both the first configuration information and the second configuration information.

12. The system of claim 11 wherein each of the first configuration information and the second configuration information comprises the bus macro information.

13. The system of claim 12 wherein the means for merging includes removing the bus macro information from either the first configuration information or the second configuration information.

14. The system of claim 12 wherein the dynamic portion of the design and the static portion of the design are for instantiation in a reserved region of the programmable device; and wherein the reserved regions is reserved for dynamic modular partial reconfiguration.

* * * * *

UNITED STATES PATENT AND TRADEMARK OFFICE
CERTIFICATE OF CORRECTION

PATENT NO. : 7,640,526 B1  Page 1 of 1
APPLICATION NO. : 11/225225
DATED : December 29, 2009
INVENTOR(S) : Blodget et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 549 days.

Signed and Sealed this

Ninth Day of November, 2010

David J. Kappos
*Director of the United States Patent and Trademark Office*